(12) United States Patent
Vissiere et al.

(10) Patent No.: US 11,709,056 B2
(45) Date of Patent: Jul. 25, 2023

(54) METHOD AND DEVICE FOR MAGNETIC FIELD MEASUREMENT BY MAGNETOMETERS

(71) Applicant: SYSNAV, Vernon (FR)

(72) Inventors: David Vissiere, Paris (FR); Mathieu Hillion, Vernon (FR)

(73) Assignee: SYSNAV, Vernon (FR)

( * ) Notice: Subject to any disclaimer, the term of this patent is extended or adjusted under 35 U.S.C. 154(b) by 348 days.

(21) Appl. No.: 16/632,284

(22) PCT Filed: Jul. 19, 2018

(86) PCT No.: PCT/FR2018/051841
§ 371 (c)(1),
(2) Date: Jan. 17, 2020

(87) PCT Pub. No.: WO2019/016477
PCT Pub. Date: Jan. 24, 2019

(65) Prior Publication Data
US 2020/0166343 A1 May 28, 2020

(30) Foreign Application Priority Data
Jul. 21, 2017 (FR) ...................................... 1756974

(51) Int. Cl.
*G01C 21/08* (2006.01)
*G01R 33/02* (2006.01)

(52) U.S. Cl.
CPC ......... *G01C 21/08* (2013.01); *G01R 33/0206* (2013.01)

(58) Field of Classification Search
CPC ............................ G01C 21/08; G01R 33/0206
See application file for complete search history.

(56) References Cited

U.S. PATENT DOCUMENTS

| 9,513,307 B2 * | 12/2016 | Vissiere | ................. | G01P 3/481 |
| 2010/0307016 A1 * | 12/2010 | Mayor | ................. | G01R 33/10 |
| | | | | 702/179 |

(Continued)

FOREIGN PATENT DOCUMENTS

| EP | 2311370 A1 | 4/2011 |
| FR | 2914739 A1 | 10/2008 |

(Continued)

OTHER PUBLICATIONS

International Preliminary Report on Patentability received for PCT Patent Application No. PCT/FR2018/051841, dated Jan. 30, 2020, 17 pages (9 pages of English Translation and 8 pages of Original Document).

(Continued)

*Primary Examiner* — Alexander Satanovsky
*Assistant Examiner* — Lynda Dinh
(74) *Attorney, Agent, or Firm* — Womble Bond Dickinson (US) LLP

(57) ABSTRACT

Magnetic field measurement by a set of magnetometers which are linked to a same moveable support and which have different orientations of eigendirections with respect to this support A processor determines, during a measurement in a given position and orientation of the support and of the set of magnetometers, for each magnetometer, of the orientation deviation between the eigendirections of the magnetometer and a candidate magnetic field, the magnetometer for which this deviation is minimal, the magnetic field measured by this sensor being selected as the magnetic field measured by the set of magnetometers. The magnetometers are distributed in space in order to cover a maximum of different orientations.

12 Claims, 3 Drawing Sheets

(56) References Cited

U.S. PATENT DOCUMENTS

2018/0313933 A1* 11/2018 Hautson .................. G06F 3/046
2019/0162537 A1*  5/2019 Rasson ............. G01R 33/0206
2019/0220106 A1*  7/2019 Leclercq ............ G06K 19/0723

FOREIGN PATENT DOCUMENTS

FR          3029642 A1    6/2016
FR          3050524 A1   10/2017

OTHER PUBLICATIONS

International Search Report and Written Opinion received for PCT Patent Application No. PCT/FR2018/051841, dated Oct. 8, 2018, 19 pages (9 pages of English Translation and 10 pages of Original Document).
Li et al., "Artificial Vector Calibration Method for Differencing Magnetic Gradient Tensor Systems", Sensors, vol. 18, 2018, 17 pages.
Mohamadabadi et al., "An Automated Indoor Scalar Calibration Method for Three-Axis Vector Magnetometers", IEEE Sensors Journal, vol. 14, No. 9, Sep. 2014, pp. 3076-3083.
Renaudin et al., "Complete Triaxis Magnetometer Calibration in the Magnetic Domain", Journal of Sensors, vol. 2010, Article ID 967245, 2010, 10 pages.

\* cited by examiner

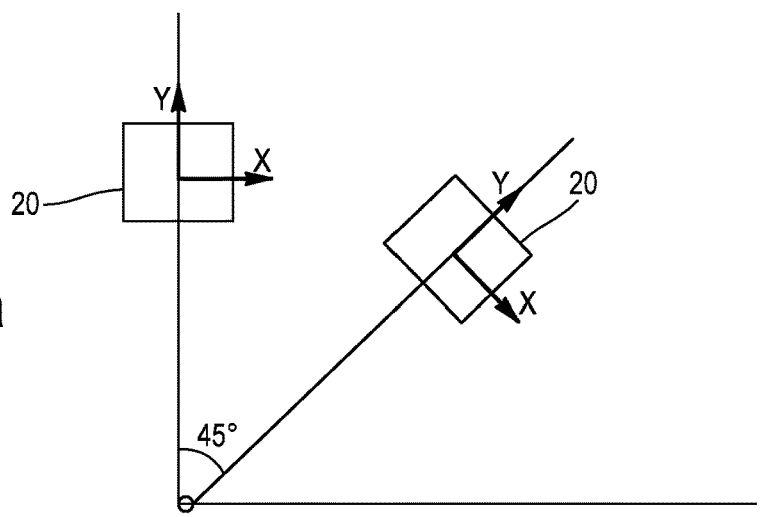
FIG. 3a
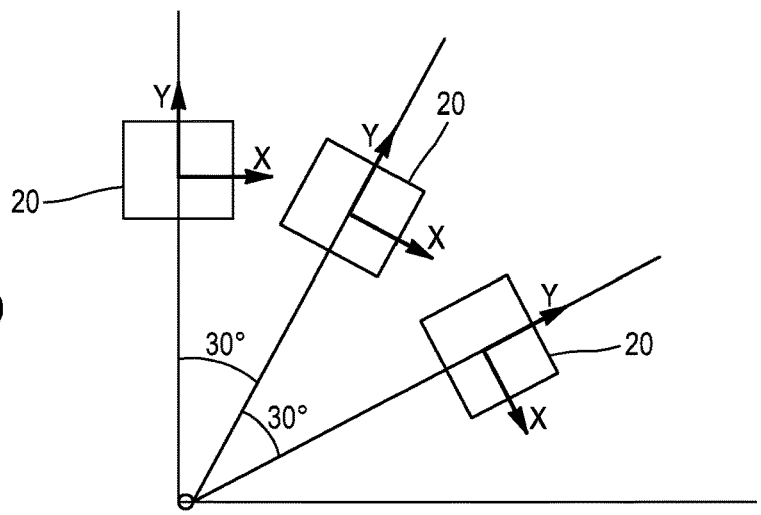
FIG. 3b
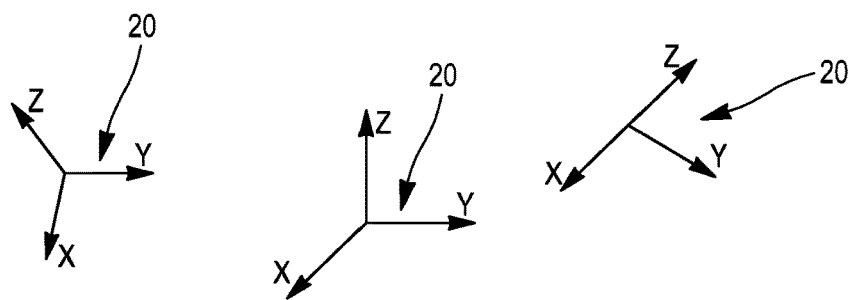
FIG. 4
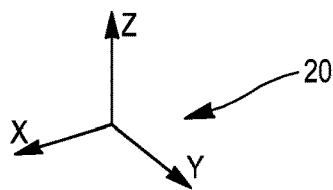

METHOD AND DEVICE FOR MAGNETIC FIELD MEASUREMENT BY MAGNETOMETERS

CROSS REFERENCE

The present application is a 371 application of International Application No.: PCT/FR2018/051841 filed on Jul. 19, 2018 which claims priority to French Application No.: FR1756974 filed on Jul. 21, 2017 which are incorporated herein by reference.

GENERAL TECHNICAL FIELD AND PRIOR ART

The present invention relates, generally speaking, to magnetic field measurement by magnetometers.

In particular, it advantageously finds application in the field of navigation without GPS, notably for the estimation of the movement of an object by magneto-inertial techniques.

General Remarks

So-called magneto-inertial navigation techniques make it possible to estimate precisely the velocity (and therefrom, by integration, the position) of a solid in a place where the magnetic field is disturbed.

Notably, it has been proposed in the patent FR2914739 to use, as a complement to the equations already used in conventional magneto-inertial techniques, the equation $\dot{B}=-\Omega \wedge B+\nabla B \cdot V$ to estimate the (linear) velocity vector V, from the angular velocity vector $\Omega$ (generally measured by gyrometers of the inertial unit), measurement of a magnetic field B, and its derivatives with respect to time $\dot{B}$ and its spatial derivates $\nabla B$ (gradient), measured or estimated.

Thanks to this information on the velocity of the solid, the error on the estimation of position will be in the worst of cases proportional to time, unlike conventional inertial techniques where it is quadratic in time.

These magneto-inertial techniques provide entire satisfaction, and require inertial sensors of lower performance than conventional inertial methods (based on integration through a Kalman filter or another observer of information coming from gyrometers and accelerometers embedded on the solid of which it is wished to estimate the position and the velocity: typically, the gyrometers "maintain" a point of reference, in which a double temporal integration of the measurements of the accelerometers makes it possible to estimate the movement) and are thus less bulky.

Thus, for example, at least one inertial unit is coupled to one or more magnetometers distributed spatially (typically 3 triaxial magnetometers arranged on the summits of a right-handed trihedron) and integral with the inertial unit (typically placed at the origin of the trihedron). The data coming from these sensors are transmitted to an electronic acquisition and calculation card which delivers position and velocity information to the user by resolution of the aforesaid equation. The use of several magnetometers makes it possible to measure directly the magnetic field gradients for example by finite difference (Taylor development), instead of estimating them. Reference may be made for example in this respect to the application FR 1653493 of the Applicant.

In this case, the information of the magnetometers is thus used to calculate linear velocity or angular velocity information.

The most conventional use of magnetometers in embedded systems concerns the calculation of heading. In this case, the hypothesis is made that the magnetic field measured by the sensor is the Earth's magnetic field which points approximately towards north. Moreover, the calculated attitude information of the system (with accelerometers and gyrometers for example) is used to determine the horizontal components My and Mx of the magnetic field.

The heading psi is then determined as follows:

$$psi = \operatorname{atan}\left(\frac{My}{Mx}\right)$$

This calculation of the heading may be carried out at the same time as the calculation of the attitude within the scope of AHRS (Attitude and Heading Reference System) algorithms.

The calculation of the heading can also be carried out at the same time as the magneto-inertial navigation techniques.

Calibration

In order that the calculations performed from magnetic field measurements (the heading calculations or the magneto-inertial navigation calculations) are right, it is firstly advisable to remove a maximum of intrinsic errors from the measurement of the magnetic sensors. The errors conventionally considered are the following: bias, scale factors, resetting of axes (geometric eigen orientation errors of each sensor axis).

The elimination of sensor errors is normally done by means of calibration of the sensor, this calibration taking place in two phases.

In a first phase, —as a function of the errors that it is wished to calibrate—a so-called "calibration" model is established linking the raw measurement of the sensor $M_B$ to the measurement of the calibrated sensor $M_C$ (what the sensor would measure if it were perfect) and the sensor errors. For example, in the case of calibration of the bias B and the matrix scale factor A of a triaxial magnetometer, the model used may be the following:

$$M_C = A \cdot M_B + B$$

In a second phase, a dedicated experimentation is implemented in order to determine the different parameters of the error model. In the case of the aforesaid example, it is necessary to identify the different components of A and B. Numerous methods have already been proposed.

A conventional method consists in turning the magnetometer in an environment without disturbance of the Earth's magnetic field, in such a way as to ensure that it only measures the Earth's field $B_T$ which is of constant norm. Optimisation methods for identifying A and B are next used in such a way that the norm of $M_C$ is equal to the norm of the Earth's magnetic field. The solution is thus formally given by:

$$\operatorname*{argmin}_{A,B \in M_{3,3}(\mathbb{R}) \times M_3(\mathbb{R})} \||A \cdot M_B + B| - |B_T|\|$$

Reference could be made for example to the following article:

"Complete Triaxis Magnetometer Calibration in the Magnetic Domain"—V. Renaudin, M. H. Afzal, and G. Lachapelle—Journal of Sensors—Volume 2010 (2010), Article ID 967245, 10 pages.

Yet other techniques may use calibration machines making it possible to generate a controlled magnetic field. An example in this sense has notably been proposed in the article:

"An Automated Indoor Scalar Calibration Method for Triaxial Vector—Magnetometers"—K. Mohamadabadi, M. Hillion—IEEE Sensors Journal, Institute of Electrical and Electronics Engineers (IEEE), 2014, 14, 3076-3083.

The system that is described therein is composed of triaxial Helmholtz coils current controlled in such a way that the generated field is of constant norm. The assembly is enclosed in magnetic shielding isolating the system from the exterior, enabling the simultaneous calculation of the bias of the sensors.

Non-Linearities

Like all sensors, magnetometers experience problems of non-linearities.

The treatment of non-linearity errors by calibration is possible, but is complex and not necessarily totally reliable.

It will indeed be understood that the greater the number of parameters to identify, the more the optimisation becomes complex to converge.

Moreover, non-linearities have a lower impact on the measurement than other parameters. Typically, for example, for AMR magnetometers, bias could have an impact of the order of 10 to 100 mG on the measurement, whereas scale factors will impact the measurement of the order of 1 to 10 mG and non-linearities only of the order of 0.1 to 1 mG.

GENERAL DESCRIPTION OF THE INVENTION

Summary

A general aim of the invention is to propose a magnetometer measurement technique making it possible to be free of calibration of non-linearities, while offering great precision and great measurement reliability.

To this end, the invention proposes a method for measuring a magnetic field, in which a magnetic field is measured by a set of magnetometers which are linked to a same moveable support and which have different orientations of eigendirections with respect to this support, characterised in that processing means implement, during a measurement in a given position and orientation of the support and of the set of magnetometers, a determination, for each magnetometer, of a "candidate" magnetic field (considering that the magnetic sensors do not have non-linearities), a determination, for each magnetometer, of the orientation deviation between the eigendirections of the magnetometer and the "candidate" magnetic field, a determination of the magnetometer for which this deviation is minimal, the magnetic field measured by this magnetometer being selected as the magnetic field measured by the set of magnetometers.

The "candidate" magnetic field determined for a sensor is for example the magnetic field of the sensor or a combination of the magnetic fields of different sensors.

The orientations of the eigendirections depend on each magnetometer.

The distribution of the magnetometers with a maximum of different orientations in space makes it possible to always find a magnetometer that has the most optimal orientation and to use its measurement as the magnetic field measurement.

This thus makes it possible to be free of non-linearities of the magnetometers without having to resort to a specific calibration for treating non-linearities.

The invention also proposes a magnetic field measurement device, as well as a magneto-inertial navigation system.

It also relates to a computer programme product including code instructions for the execution of such a magnetic field measurement method, as well as a storage means readable by a computer equipment on which a computer programme product includes code instructions for the execution of such a method.

DESCRIPTION OF THE FIGURES

Other characteristics and advantages of the invention will become clearer from the description that follows, which is purely illustrative and non-limiting, and should be read with regard to the appended figures in which:

FIG. 3a illustrates a configuration of a device in accordance with an embodiment of the invention in which two magnetometers are distributed in a same plane;

FIG. 3b illustrates a flat configuration with three magnetometers;

FIG. 4 illustrates a configuration with four magnetometers distributed in space.

DESCRIPTION OF ONE OR MORE EMBODIMENTS

General Remarks

Figure 1:
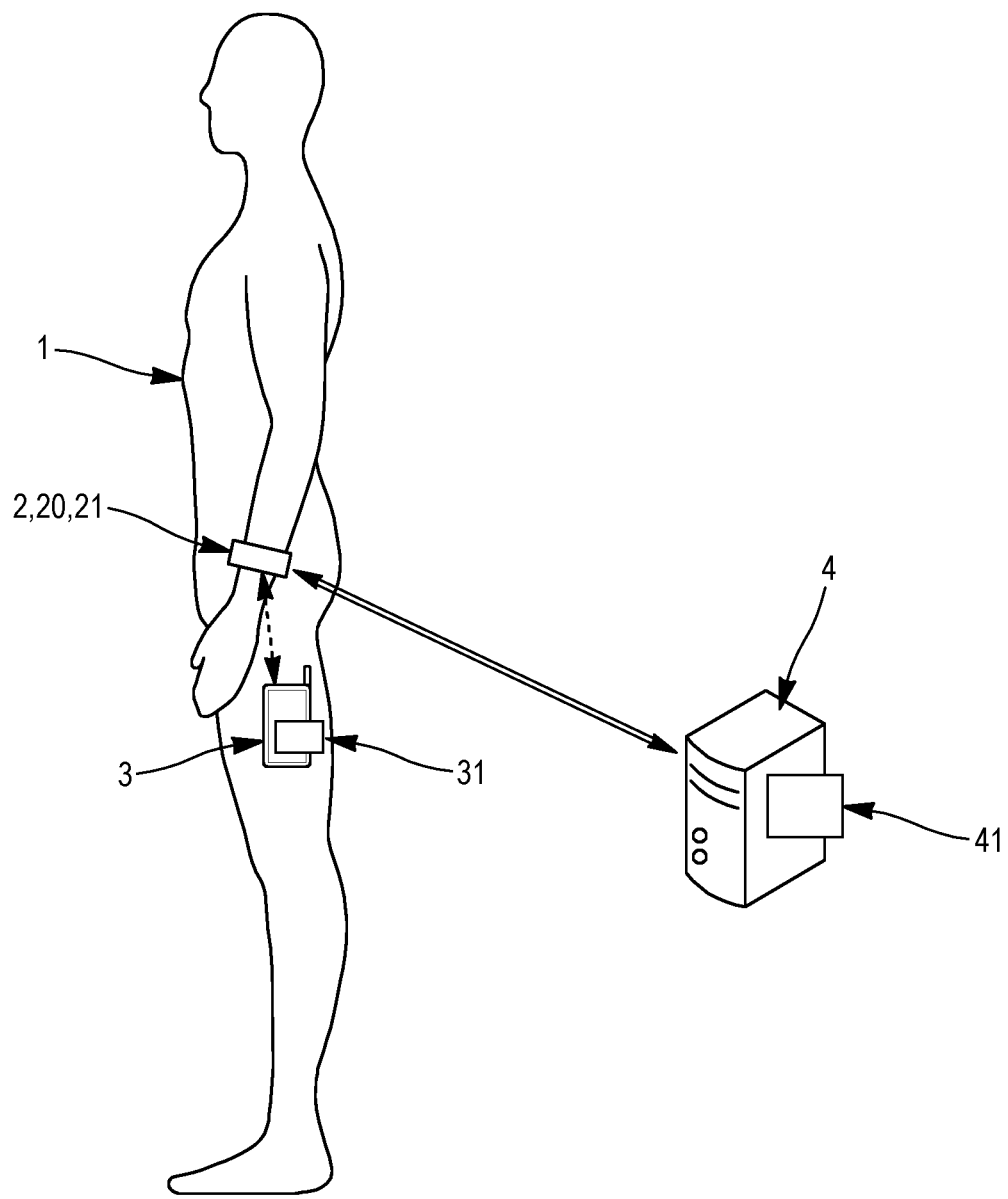
FIG. 1 is a diagram of equipment for the implementation of the method according to the invention.

With reference to FIG. 1, the proposed measurement device is for example used for the estimation of the movement of an object 1 moving in an ambient magnetic field (typically the Earth's magnetic field, which could be slightly altered by nearby metal objects), noted $\vec{B}$. As is known, the magnetic field is a three-dimensional vector field, that is to say associating a vector of three dimensions with each three-dimensional point in which the object is moveable.

This object 1 may be any moveable object of which knowledge of the position is desired, for example a wheeled vehicle, a drone, etc., but also a pedestrian.

The object 1 comprises in a case 2 (support) a plurality of magnetic measurement sensors 20, i.e. axial magnetometers 20. Axial magnetometer is taken to mean an element capable of measuring a component of said magnetic field, i.e. the projection of said magnetic field vector $\vec{B}$ at the level of said magnetometer 20 along its axis.

More precisely, the magnetometers 20 are integral with the case 2. They have a movement substantially identical to the case 2 and to the object 1 in the terrestrial reference frame.

Preferably, the reference frame of the object 1 is provided with an orthonormal cartesian point of reference in which the magnetometers 20 have a predetermined position in this point of reference.

Figure 2:
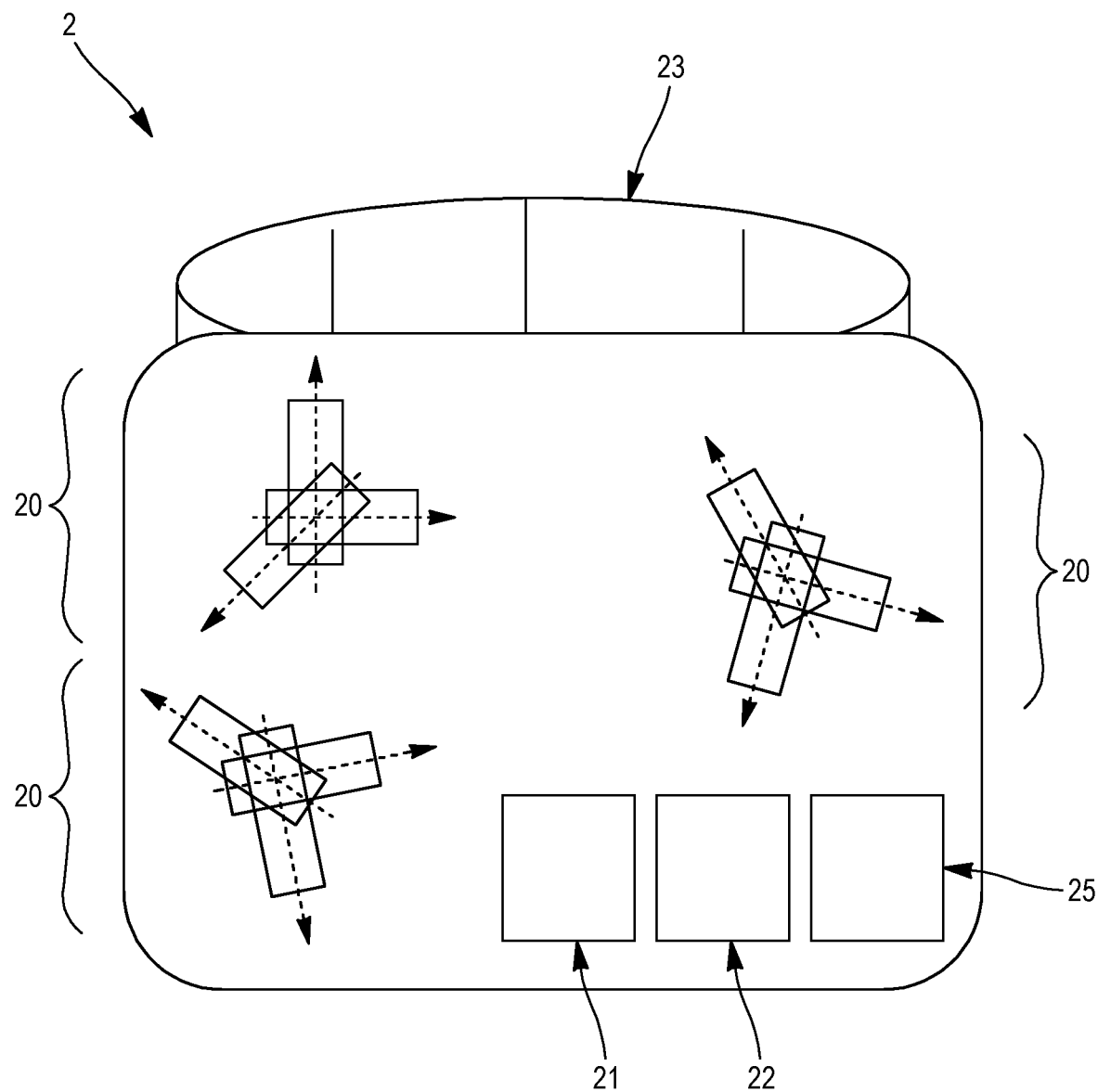
FIG. 2 represents in greater detail an example of case for the implementation of the method according to the invention.

In FIG. 2, the case 2 is fixed onto the object 1 (for example a limb of the pedestrian) by attachment means 23. These attachment means 23 consist for example of a bracelet, for example a self-gripping strap that grips the limb and enables an integral link.

Obviously, the invention is not limited to the estimation of the movement of a pedestrian, but it is particularly advantageous in such a use because it enables very reduced bulk, which is necessary for the case to be portable by a human in an ergonomic manner.

The case 2 may include processing means 21 (typically a processor) for implementing directly in real time the processing operations of the present method, or instead the measurements may be transmitted via communication means 25 to an external device such as a mobile terminal (smartphone) 3, or even a remote server 4, or instead the measurements may be recorded in local data storage memory means 22 (a flash type memory for example) for a posteriori processing for example on the server 4.

The communication means 25 may implement a short range wireless communication, for example Bluetooth or Wi-Fi (in particular in an embodiment with a mobile terminal 3) or even be means for connecting to a mobile network (typically UMTS/LTE) for a long distance communication. It should be noted that the communication means 25 may be for example a wired connection (typically USB) for transferring data from the local data storage means 22 to those of a mobile terminal 3 or a server 4.

If it is a mobile terminal 3 (respectively a server 4) that hosts the "intelligence", it includes processing means 31 (respectively 41) such as a processor for implementing the processing operations of the present method that are going to be described. When the processing means used are those 21 of the case 2, it may further include communication means 25 for transmitting the estimated position. For example, the position of the bearer may be sent to the mobile terminal 3 to display the position in a navigation software interface.

The data processing means 21, 31, 41 respectively of the case 2, a smartphone 3 and a remote server 4 may indifferently and depending on the applications carry out all or parts of the steps of the method.

They each comprise to this end storage means in which are memorised all or part of the sequences of code instructions for the execution of the method.

Arrangement and Orientation of the Magnetometers in Space

Each magnetometer sensor, whatever its structure, has directions, called eigendirections in the remainder of the text, for which the impact of linearities is minimal.

The magnetometers 20 are arranged in the case 2 so as to cover a multitude of different orientations for these eigendirections.

In the case illustrated in FIGS. 3a and 3b, the case of biaxial magnetometers 20 each having two eigenaxes X and Y (in this particular instance perpendicular) has been represented.

The planes formed by the eigenaxes X and Y of each of these magnetometers 20 are parallel (coplanar in the examples of these figures).

In FIG. 3a, the sensor comprises two coplanar biaxial magnetometers 20. These magnetometers 20 are distributed in such a way that their eigenaxes are angularly separated by 45°.

Indeed, it will be understood that such a distribution optimises the probability that a magnetic field in the plane XY is angularly close to the eigendirection of one of the sensors.

In the case illustrated in FIG. 3b, the system comprises three biaxial magnetometers distributed according to a coplanar arrangement of the different eigenaxes X and Y of the magnetometers 20. These magnetometers 20 are oriented in such a way that the eigenaxes of two successive magnetometers are angularly separated by 30°.

It will be understood again here that such a distribution optimises the probability that a magnetic field in the plane XY is angularly close to the eigendirection of one of the sensors.

Obviously these two examples are generalised to the case of m coplanar biaxial magnetometers or distributed in parallel planes of the device (with m a whole number).

In this case, the optimal distribution is a distribution of magnetometers separated by angles of 90°/m, but it will be easily understood that the invention is not limited to this optimal distribution.

FIG. 4 illustrates for its part the case of four triaxial magnetometers each having three perpendicular eigenaxes X, Y and Z. It illustrates a distribution of the orientations of these four magnetometers in space which enables an optimisation of the angular proximity between a magnetic field B to measure and at least one eigendirection of one of the magnetometers 20.

In a more general manner, in the case of triaxial magnetometers, the distribution of their orientations is chosen with a maximum of orientations in space in order to maximise the probability of finding a magnetometer that has the most optimal orientation (optimisation of the distribution of their eigendirections).

Choice of the Magnetometer for a Given Measurement

For each magnetometer j, $(\vec{d_i^j})_{i \in [\![1 \ldots n]\!]}$ designates the n measurement eigendirections of this sensor, that is to say the directions linked to this sensor for which the impact of non-linearities is minimal. The number of these eigendirections depends on the type of sensor.

The processing means calculate for each magnetometer a candidate magnetic field by considering that the magnetometers are not disturbed by non-linearities. Indeed, since the effect of non-linearities is small, it is possible to assume as a first approximation that the magnetic field supplied by each sensor is not too poor, in any case that it suffices for the remainder of the method. The candidate magnetic field of a sensor may be the magnetic field measured by this sensor or an astute combination (such as the average for example) of the magnetic fields measured by all the sensors. Hereafter, the simplest case will be considered where the candidate magnetic field of a sensor is the magnetic field measured by said sensor.

The processing means (depending on the case 21, 31 or 41) calculate for each sensor the orientation deviation between the magnetic field measured by the sensor and its eigendirections. If $\vec{B_B^j}$ is the "candidate" magnetic field for the sensor j, the deviation $e^j$ between the eigendirections and $\vec{B_B^j}$ is given by $$e^j = \min_{i \in [\![1,n]\!]} \left(\vec{d_i^j}, \vec{B_B^j}\right)$$

where $(\vec{d_i^j}, \vec{B_B^j})$ is the angle between the two vectors $\vec{d_i^j}$ and $\vec{B_B^j}$.

The processing means 21, 31 or 41 next determine the sensor j for which the deviation $e^j$ is minimal.

It is from this sensor that the best measurement is obtained, in the sense where the impact of non-linearities is the lowest on the measurement.

The magnetic field measured by the magnetometer j thereby determined is thus retained by the processing means 21, 31, 41 as the magnetic field measured by the set of magnetometers.

The field measurement of the magnetometer j is stored by said processing means 21, 31, 41 and/or used by said processing means in the calculation of magneto-inertial navigation information (linear velocity, angular velocity, position, heading, etc.).

In these calculations, the measurement of the field j is then used as measurement of the magnetic field at the considered time, corresponding to a position/orientation of the set of magnetometers.

The processing operations are then advantageously of the type of those described in the patent FR2914739 or in the application FR 1653493.

As will have been understood, the fact of using the "candidate" magnetic field of the magnetometer for which the deviation is minimal makes it possible to have available a measurement not disturbed by non-linearities of the magnetometers and to do so without having to resort to a specific calibration to treat said non-linearities.

Obviously, the proposed calibration method and device may be used in combination with calibrations intended to correct not non-linearity errors but other error parameters of the sensor according to known methods.

Eigendirections

The eigendirections are determined beforehand for each sensor.

This determination may be done for example from modelling of the error terms of the considered sensor, or by an analysis of the physics of the sensor and/or its implementation.

An example of modelling and determination of eigendirections is given hereafter, other modellings and determinations obviously being possible.

Case of AMR Magnetometers—Modelling of Non-Linearities

The magnetometers 20 are for example each composed of three identical chips, the operation of which is based on so-called AMR (Anisotropic Magneto-Resistance) technology.

When these chips are immersed in a magnetic field, they send back a voltage which comes close to an affine function of the component of the magnetic field in the direction of their sensitivity axis.

Conventionally, the magnetometric measurements of a sensor of sensitivity axis X and of main plane XY (with Y the direction perpendicular to X) are modelled as follows (see for example *Handbook of Magnetic Measurements*, S. Tumanski):

$$M_B^X = \frac{M_C^X}{1 + M_C^Y/H_0}$$

Where $M_B^X$ is the magnetic field measured by the sensor and where $M_C^X$ and $M_C^Y$ are the magnetic fields along the axes X and Y. $H_0$ is the remanent field, assumed large compared to the magnetic fields in play.

It is possible to form a triaxial AMR magnetometer. Such a magnetometer is analysed as formed of 3 monoaxial sensors, of which the non-linearity model is $$\begin{cases} M_B^X = \dfrac{M_C^X}{1 + M_C^Y/H_0} \\ M_B^Y = \dfrac{M_C^Y}{1 - M_C^X/H_0} \\ M_B^Z = \dfrac{M_C^Z}{1 + M_C^Y/H_0} \end{cases}$$

Case of AMR Magnetometers—Determination of Eigendirections

As a function of the measured magnetic field, the impact of non-linearity is not the same on the measurement of the sensor. Thus, it may be directly read on the model that:

When the field is aligned with the sensor axes, non-linearities do not hinder the measurement of the sensor. Indeed:

If the field $M_C^X$ is more or less aligned with the sensor axis X, one has $M_C^Y \approx M_C^X \approx 0$, which gives $M_B^X \approx M_C^X$ $M_B^Y \approx 0$ $M_B^Z \approx 0$ If the field $M_C^Y$ is more or less aligned with the sensor axis Y, one has $M_C^X \approx M_C^Z \approx 0$, which gives $M_B^X \approx 0$ $M_B^Y \approx M_C^Y$ $M_B^Z \approx 0$ If the field $M_C^Z$ is more or less aligned with the sensor axis Z, one has $M_C^Z \approx M_C^Y \approx 0$, which gives $M_B^X \approx 0$ $M_B^Y \approx 0$ $M_B^Z \approx M_C^Z$ When the field is not aligned with the sensor axes, non-linearities hinder the measurement of the sensor.

In the case of a magnetic field oriented at 45° with respect to the axes X and Y, one then has $$M_C^X \approx \frac{\sqrt{2}}{2} M_C$$

$$M_C^Y \approx \frac{\sqrt{2}}{2} M_C$$

$$M_C^Z \approx 0$$

Which gives a measured field $$\begin{cases} M_B^X = \dfrac{\frac{\sqrt{2}}{2} M_C}{1 + \frac{\sqrt{2}}{2} M_C/H_0} \approx \frac{\sqrt{2}}{2} M_C - \frac{1}{2} \frac{M_C^2}{H_0} \\ M_B^Y = \dfrac{\frac{\sqrt{2}}{2} M_C}{1 - \frac{\sqrt{2}}{2} M_C/H_0} \approx \frac{\sqrt{2}}{2} M_C + \frac{1}{2} \frac{M_C^2}{H_0} \\ M_B^Z \approx 0 \end{cases}$$

The optimal directions (eigenaxes) in the case of this model are thus the sensor axes.

The invention claimed is:

1. A method comprising:
   measuring candidate magnetic fields using different magnetometers included in a moving device, wherein each of the different magnetometers have different eigendirections,
   computing a set of deviations respectively associated with the different magnetometers, wherein each of the deviations is computed as follows:

$$e^j = \min_{i \in [\![1..n]\!]} \left(\vec{d_i^j}, \vec{B_B^j}\right)$$

wherein
   $e^j$ is a respective one of the deviations associated with a j-th magnetometer among the different magnetometers,
   $(\vec{d_i^j})_{i \in [\![1 \ldots n]\!]}$ is a vector representing an i-th eigendirection of the j-th magnetometer,
   $\vec{B_B^j}$ is a vector representing the candidate magnetic field measured by the j-th magnetometer,
   $(\vec{d_i^j}, \vec{B_B^j})$ is an angle between $\vec{d_i^j}$ and $\vec{B_B^j}$,
   n is an integer greater than 1,
   selecting a magnetometer among the different magnetometers, wherein the selected magnetometer is associated with the respective one of the deviations that is minimal and wherein the selected magnetometer has measured a magnetic field least impacted by non-linearities, and
   using by a magneto-inertial navigation system the magnetic field measured by the selected magnetometer wherein said magnetic field is the least impacted by non-linearities without having resorted to a specific calibration to treat said non-linearities.

2. The method according to claim 1, in which the candidate magnetic field for a respective one of the different magnetometers is measured by said respective one of the different magnetometers.

3. The method according to claim 1, in which the different eigendirections of a magnetometer are determined by modelling prior to said measuring.

4. A non-transitory computer program product including code instructions for the execution of the method according to claim 1, when said programme is executed on a computer.

5. A storage device readable by a computer equipment on which a computer program product includes code instructions for the execution of the method according to claim 1.

6. The method according to claim 1, comprising: calculating magnetic navigation information of the moving device using the selected magnetic field.

7. The method according to claim 6, wherein the magnetic navigation information comprises at least one of: a linear velocity, an angular velocity, a position, and a heading.

8. A device comprising magnetometers each having different eigendirections, the magnetometers being configured to measure candidate magnetic fields, wherein the device further comprises a processor that is configured to:
   compute the deviations respectively associated with the magnetometers, wherein each of the deviations is computed as follows:

$$e^j = \min_{i \in [\![1..n]\!]} \left(\vec{d_i^j}, \vec{B_B^j}\right)$$

wherein
   $e^j$ is a respective one of the deviations associated with a j-th magnetometer among the magnetometers,
   $(\vec{d_i^j})_{i \in [\![1 \ldots n]\!]}$ is a vector representing an i-th eigendirection of the j-th magnetometer,
   $\vec{B_B^j}$ is a vector representing the candidate magnetic field measured by the j-th magnetometer,
   $(\vec{d_i^j}, \vec{B_B^j})$ is an angle between $\vec{d_i^j}$ and $\vec{B_B^j}$;
   n is an integer greater than 1,
   select a magnetometer among the magnetometers, wherein the selected magnetometer is associated with the respective one of the deviations that is minimal and wherein the selected magnetometer corresponds to the magnetometer having measured a magnetic field least impacted by non-linearities, and
   use by a magneto-inertial navigation system the magnetic field measured by the selected magnetometer wherein said magnetic field is the least impacted by non-linearities without having resorted to a specific calibration to treat said non-linearities.

9. The device according to claim 8, wherein the magnetometers comprise a flat configuration of the magnetometers with two eigenaxes, the magnetometers being parallel, orientations of the different eigendirections of the magnetometers being distributed such that eigenaxes of the magnetometers are separated angularly by an angle of 90°/m, wherein m is a number of the magnetometers.

10. The device according to claim 8, in which the magnetometers are parallel.

11. The device according to claim 8, in which the magnetometers are of triaxial type, the different eigendirections of the magnetometers being distributed in order to optimize a distribution of the different eigendirections of the magnetometers in space.

12. A navigation system comprising at least one device according to claim 8.

* * * * *